(12) United States Patent
Lin et al.

(10) Patent No.: US 9,911,812 B2
(45) Date of Patent: *Mar. 6, 2018

(54) SEMICONDUCTOR DEVICE HAVING A FIN SHELL COVERING A FIN CORE

(71) Applicant: Taiwan Semiconductor Manufacturing Company Limited, Hsinchu (TW)

(72) Inventors: Chun-Hsiung Lin, Hsinchu County (TW); Carlos H. Diaz, Mountain View, CA (US); Hui-Cheng Chang, Tainan (TW); Syun-Ming Jang, Hsin-Chu (TW); Mao-Lin Huang, Hsinchu (TW); Chien-Hsun Wang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/937,327

(22) Filed: Nov. 10, 2015

(65) Prior Publication Data

US 2016/0064493 A1 Mar. 3, 2016

Related U.S. Application Data

(62) Division of application No. 14/719,908, filed on Feb. 13, 2014, now Pat. No. 9,214,513.

(51) Int. Cl.
| | | |
|---|---|---|
| *H01L 29/205* | (2006.01) | |
| *H01L 29/06* | (2006.01) | |
| *H01L 29/78* | (2006.01) | |
| *H01L 29/267* | (2006.01) | |
| *H01L 29/10* | (2006.01) | |
| *H01L 21/762* | (2006.01) | |

(52) U.S. Cl.
CPC ........ *H01L 29/205* (2013.01); *H01L 29/0649* (2013.01); *H01L 29/0653* (2013.01); *H01L 29/0657* (2013.01); *H01L 29/1054* (2013.01); *H01L 29/267* (2013.01); *H01L 29/785* (2013.01); *H01L 29/7853* (2013.01); *H01L 21/76224* (2013.01)

(58) Field of Classification Search
None
See application file for complete search history.

(56) References Cited

U.S. PATENT DOCUMENTS

| | | | | |
|---|---|---|---|---|
| 9,214,513 | B2 * | 12/2015 | Lin | .............. H01L 29/0657 |
| 2005/0017377 | A1 * | 1/2005 | Joshi | ................ H01L 21/84 |
| | | | | 257/368 |
| 2007/0004224 | A1 * | 1/2007 | Currie | ............... H01L 21/3141 |
| | | | | 438/778 |
| 2008/0233697 | A1 * | 9/2008 | Huffman | ........... H01L 29/66795 |
| | | | | 438/283 |

(Continued)

*Primary Examiner* — Bilkis Jahan
(74) *Attorney, Agent, or Firm* — Jones Day

(57) ABSTRACT

According to an exemplary embodiment, a method of forming a fin structure is provided. The method includes the following operations: etching a first dielectric layer to form at least one recess and a first core portion of a fin core; form an oxide layer as a shallow trench isolation layer in the recess; etching back the oxide layer to expose a portion of the fin core; and forming a fin shell to cover a sidewall of the exposed portion of the fin core.

20 Claims, 17 Drawing Sheets

(56) References Cited

U.S. PATENT DOCUMENTS

| | | | |
|---|---|---|---|
| 2011/0147711 A1* | 6/2011 | Pillarisetty | B82Y 10/00 257/24 |
| 2011/0147811 A1* | 6/2011 | Kavalieros | H01L 29/66795 257/288 |
| 2013/0134481 A1* | 5/2013 | Bhuwalka | H01L 29/66795 257/192 |
| 2013/0223139 A1* | 8/2013 | Okano | G11C 11/34 365/157 |
| 2014/0252414 A1 | 9/2014 | Merckling et al. | |

* cited by examiner

600

600

600

600

SEMICONDUCTOR DEVICE HAVING A FIN SHELL COVERING A FIN CORE

CROSS-REFERENCE TO RELATED APPLICATIONS

This application is a divisional application of U.S. patent application Ser. No. 14/179,908, entitled "FIN STRUCTURE AND METHOD FOR FORMING THE SAME," filed Feb. 13, 2014, which is incorporated herein by reference in its entirety.

BACKGROUND

This disclosure relates generally to semiconductor processes, and, more particularly, to a fin structure and a method for forming the same.

Semiconductor devices with fin-type channels are more and more popular. However, fabrication of said devices is difficult due to tight design rules for the width, the spacing, the depth, and the complication of the process. Therefore, there is a need to provide a new structure for those semiconductor devices with fin-type channels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
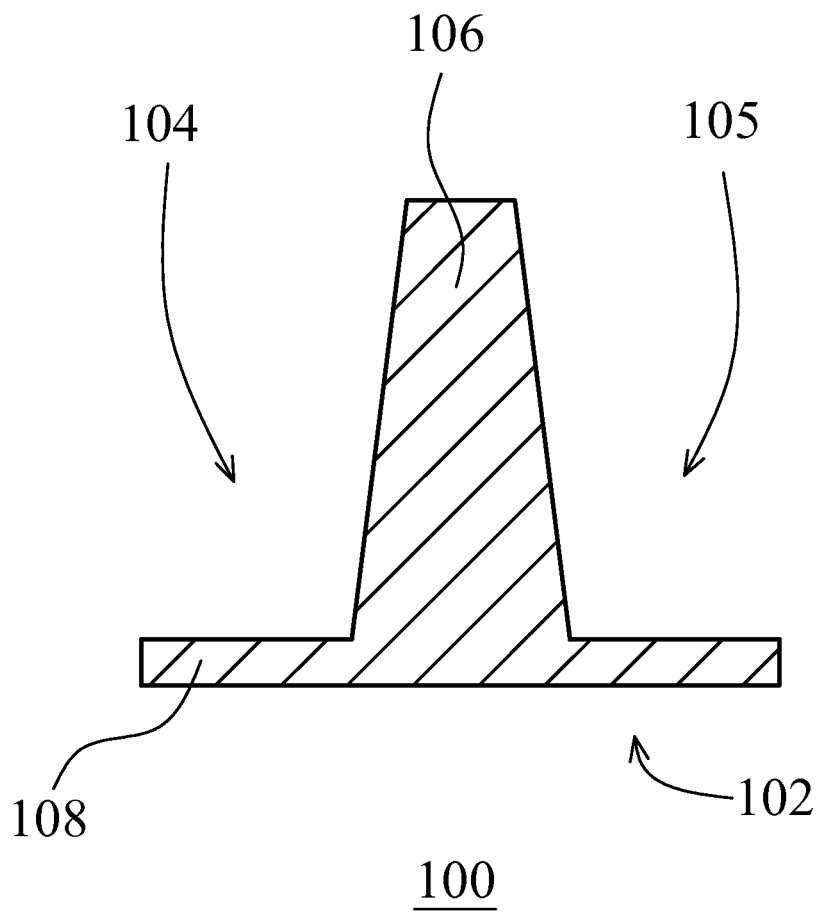
FIG. 1 is a sectional view illustrating an exemplary structure for forming a fin structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a sectional view illustrating an exemplary structure for forming a fin structure 100 in accordance with some embodiments. As shown in FIG. 1, a first dielectric layer 102 is provided. The first dielectric layer 102 is etched to form two recesses 104, 105 and a fin core 106 protruding from a substrate 108.

Figure 2:
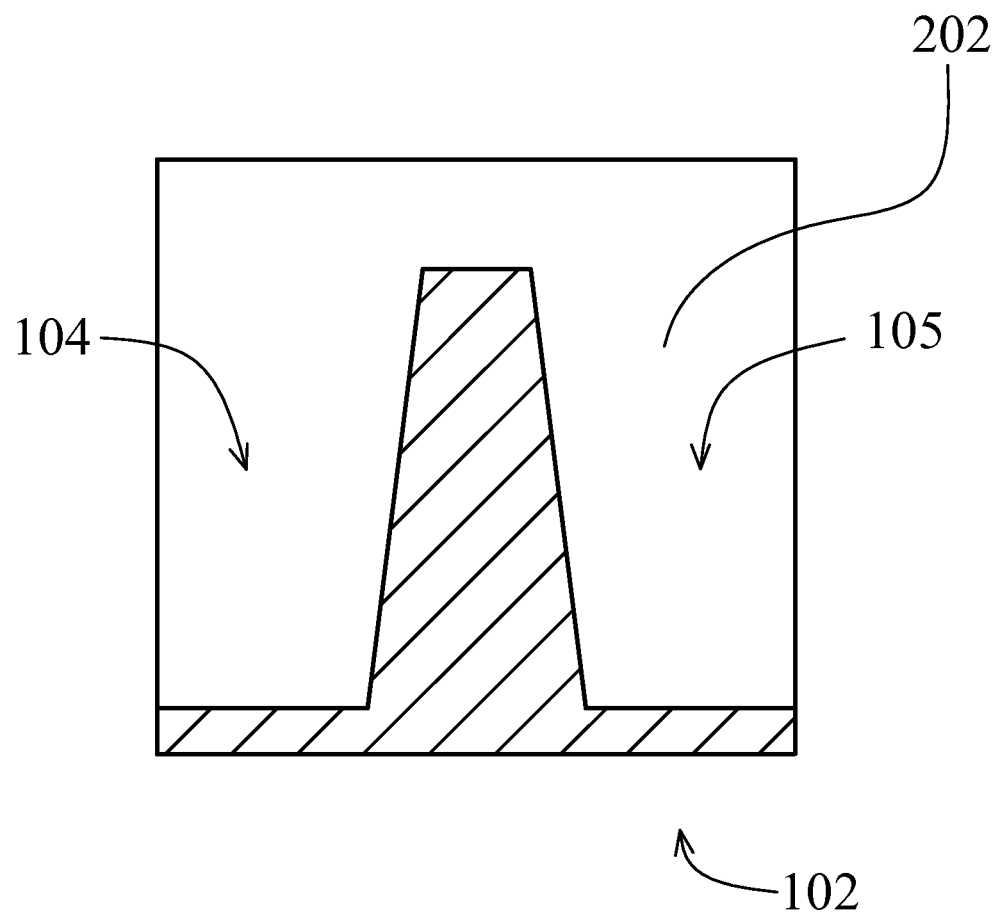
FIG. 2 is a sectional view illustrating the exemplary structure for forming the fin structure in accordance with some embodiments.

FIG. 2 is a sectional view illustrating the exemplary structure for forming the fin structure 100 in accordance with some embodiments. As shown in FIG. 2, an oxide layer 202 is formed as a shallow trench isolation layer over the first dielectric layer 102 and in the recesses 104, 105.

Figure 3:
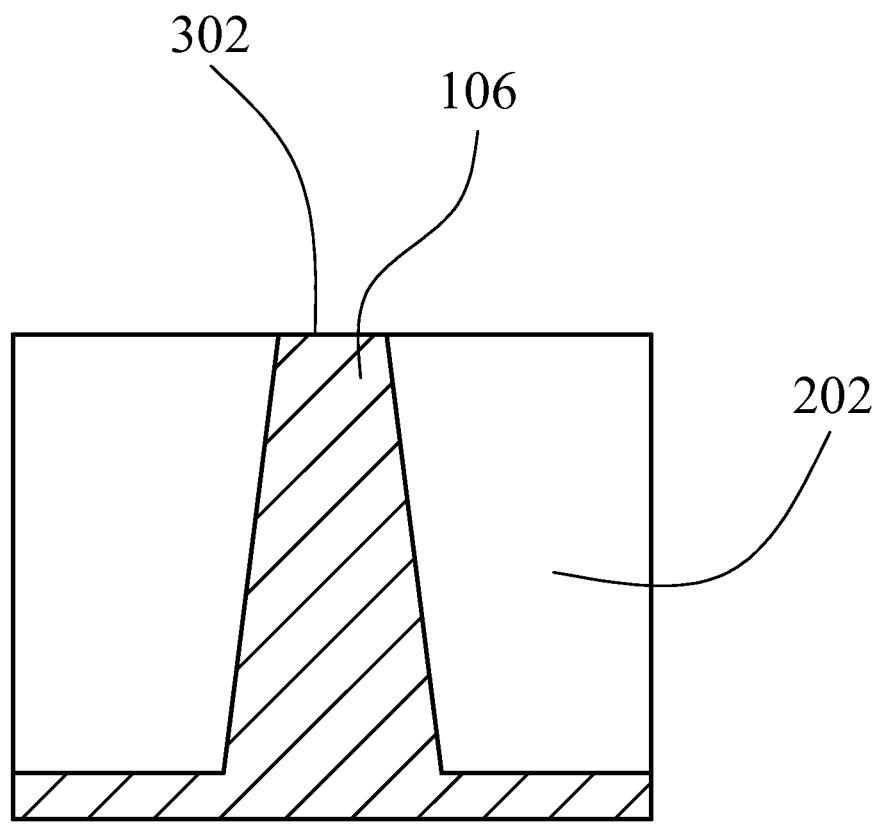
FIG. 3 is a sectional view illustrating the exemplary structure for forming the fin structure in accordance with some embodiments.

FIG. 3 is a sectional view illustrating the exemplary structure for forming the fin structure 100 in accordance with some embodiments. As shown in FIG. 3, a chemical mechanical polishing is performed on the oxide layer 202 and stops on the top 302 of the fin core 106.

Figure 4:
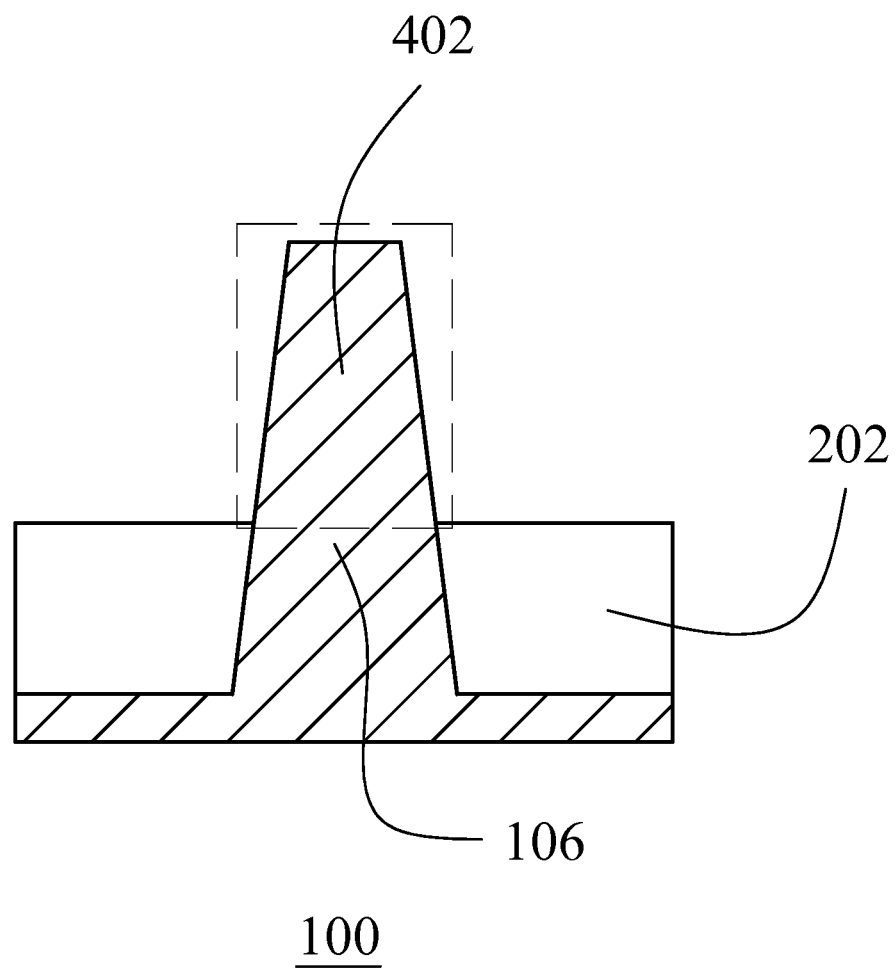
FIG. 4 is a sectional view illustrating the exemplary structure for forming the fin structure in accordance with some embodiments.

FIG. 4 is a sectional view illustrating the exemplary structure for forming the fin structure 100 in accordance with some embodiments. As shown in FIG. 4, the oxide layer 202 is etched back to expose a portion 402 of the fin core 106.

Figure 5:
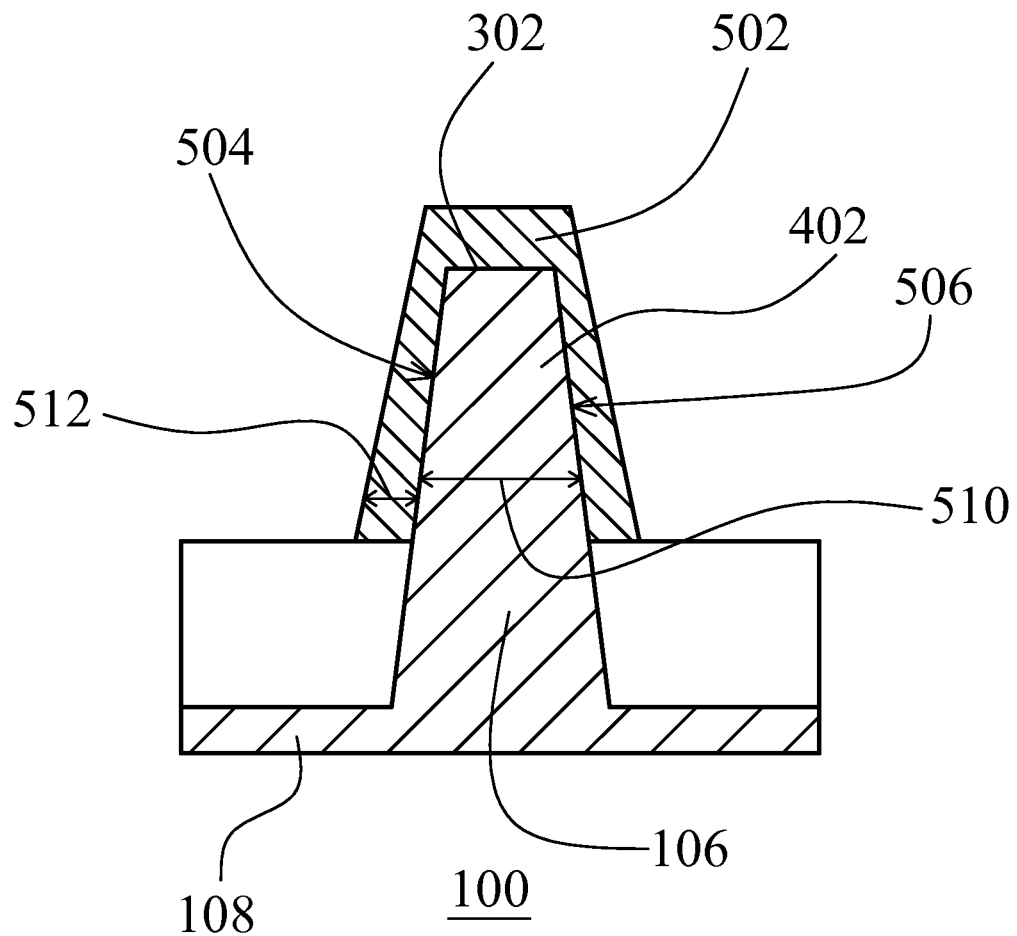
FIG. 5 is a sectional view illustrating the exemplary structure for forming the fin structure in accordance with some embodiments.

FIG. 5 is a sectional view illustrating the exemplary structure for forming the fin structure 100 in accordance with some embodiments. As shown in FIG. 5, a fin shell 502 is formed to cover sidewalls 504, 506 of the exposed portion 402 of the fin core 106. In the embodiment, the top 302 of the fin core 106 is covered by the fin shell 502. In another embodiment, the fin shell 502 over the top 302 of the fin core 106 may be further removed to reduce lattice dislocation.

In detail, the fin structure 100 at least includes the fin core 106 and the fin shell 502. The fin core 106 protrudes from the substrate 108, and the fin shell 502 covers a portion of sidewalls 504, 506 of the fin core 106. The oxide layer 202 is disposed as a shallow trench isolation layer between the fin shell 502 and the substrate 108.

The fin structure 100 may integrate lattice-mismatched layers by using existing technologies. In the embodiment, the fin core 106 may be formed of silicon having a lattice constant of 5.431 angstrom, and the fin shell 502 may be formed of germanium having a lattice constant of 5.658 angstrom. In another embodiment, the fin core 106 may be formed of silicon or germanium, and the fin shell 502 may be formed of III-V compounds.

The fin structure 100 may be used as a quantum confinement structure with a fin shell 502 as the channel layer and with a fin core 106 as the barrier layer. The fin core 106 may enhance the device performance by alleviate scattering from the fin shell 502 across the fin core 106. Additionally, the fin core 106 may be used as a buffer layer to alleviate lattice dislocation in the fin shell 502 or in the fin core 106.

Due to channel quantum confinement and channel formation, the fin core 106 may have a width 510 of about several nanometers to tens of nanometers, for example, 3 nm-15 nm. The fin shell 502 may have a thickness 512 of about several nanometers to tens of nanometers, for example, 2 nm-10 nm. Further details of selecting the thickness 512 of the fin shell 502 and the width 510 of the fin core 106 may be elaborated later. Additionally, said width 510 and said thickness 512 may refer to a minimum, a maximum or an average. With careful selection of the fin shell thickness 512 and the fin core width 510, the fin structure 100 may endure about 0-4% lattice mismatch between the fin core 106 and the fin shell 502 without lattice dislocation.

Figure 6:
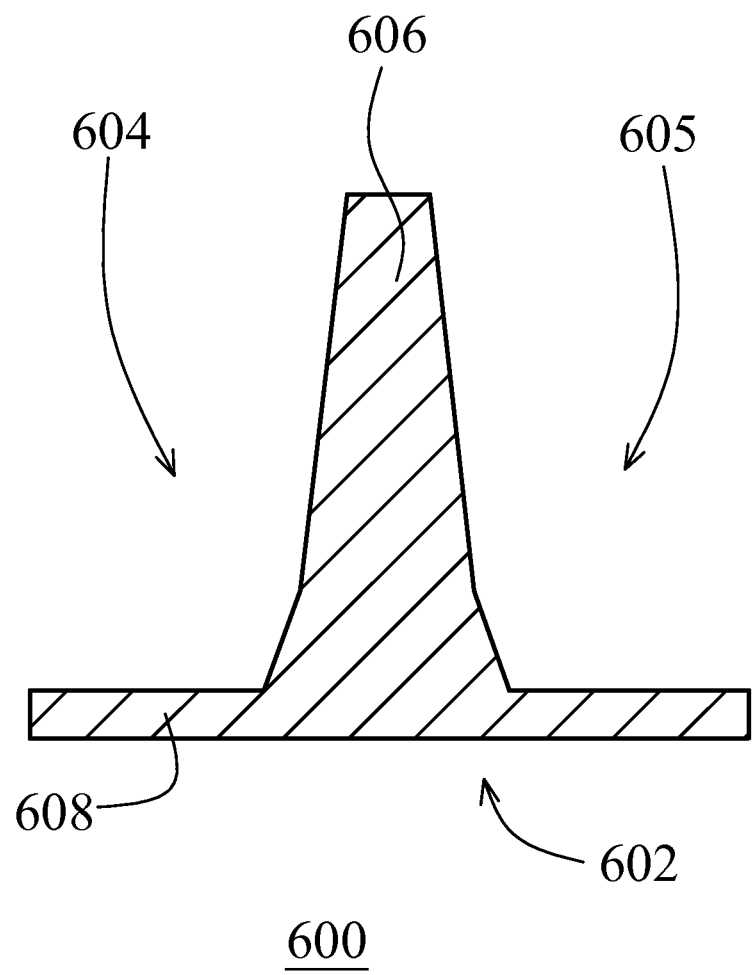
FIG. 6 is a sectional view illustrating an exemplary structure for forming a fin structure in accordance with some embodiments.

FIG. 6 is a sectional view illustrating an exemplary structure for forming a fin structure 600 in accordance with some embodiments. As shown in FIG. 6, a first dielectric layer 602 is provided. The first dielectric layer 602 is etched to form a substrate 608, two recesses 604, 605 and a fin core 606.

Figure 7:
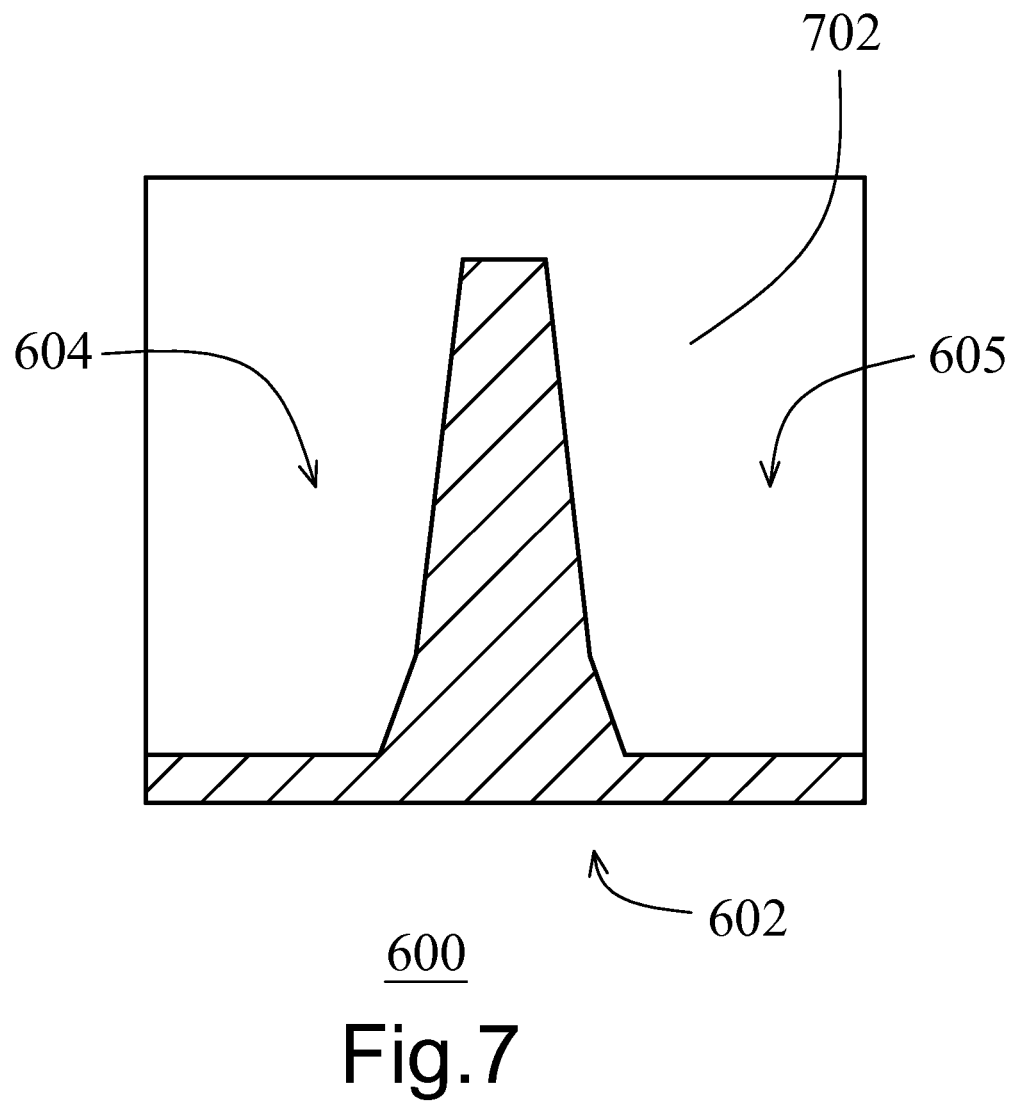
FIG. 7 is a sectional view illustrating the exemplary structure for forming the fin structure in accordance with some embodiments.

FIG. 7 is a sectional view illustrating the exemplary structure for forming the fin structure 600 in accordance with some embodiments. As shown in FIG. 7, an oxide layer 702 is formed as a shallow trench isolation layer over the first dielectric layer 602 in the recesses 604, 605.

Figure 8:
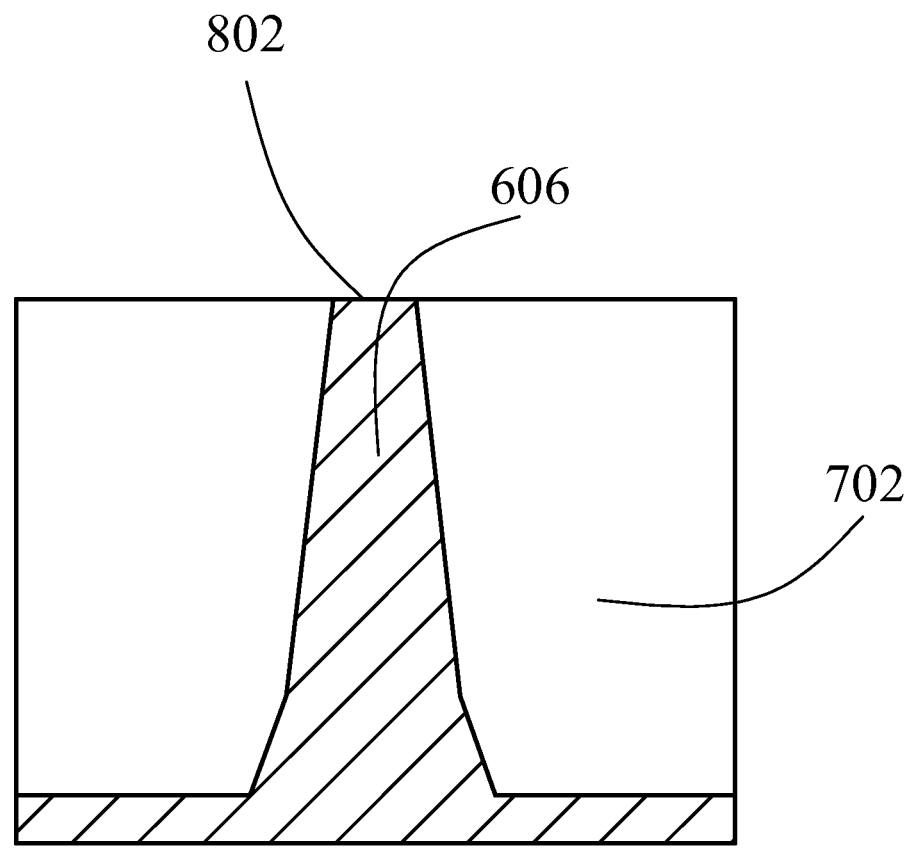
FIG. 8 is a sectional view illustrating the exemplary structure for forming the fin structure in accordance with some embodiments.

FIG. 8 is a sectional view illustrating the exemplary structure for forming the fin structure 600 in accordance with some embodiments. As shown in FIG. 8, a chemical mechanical polishing is performed on the oxide layer 702 and stops on the top 802 of the fin core 606.

Figure 9:
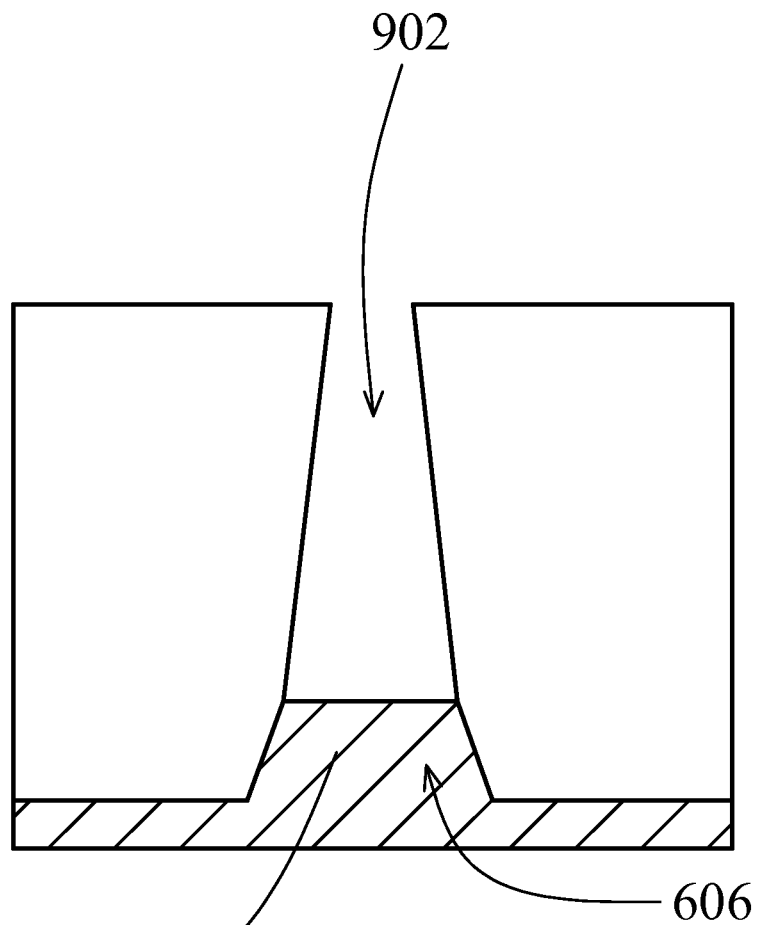
FIG. 9 is a sectional view illustrating the exemplary structure for forming the fin structure in accordance with some embodiments.

FIG. 9 is a sectional view illustrating the exemplary structure for forming the fin structure 600 in accordance with some embodiments. As shown in FIG. 9, the fin core 606 is etched back to form a second recess 902 and a first core portion 904.

Figure 10:
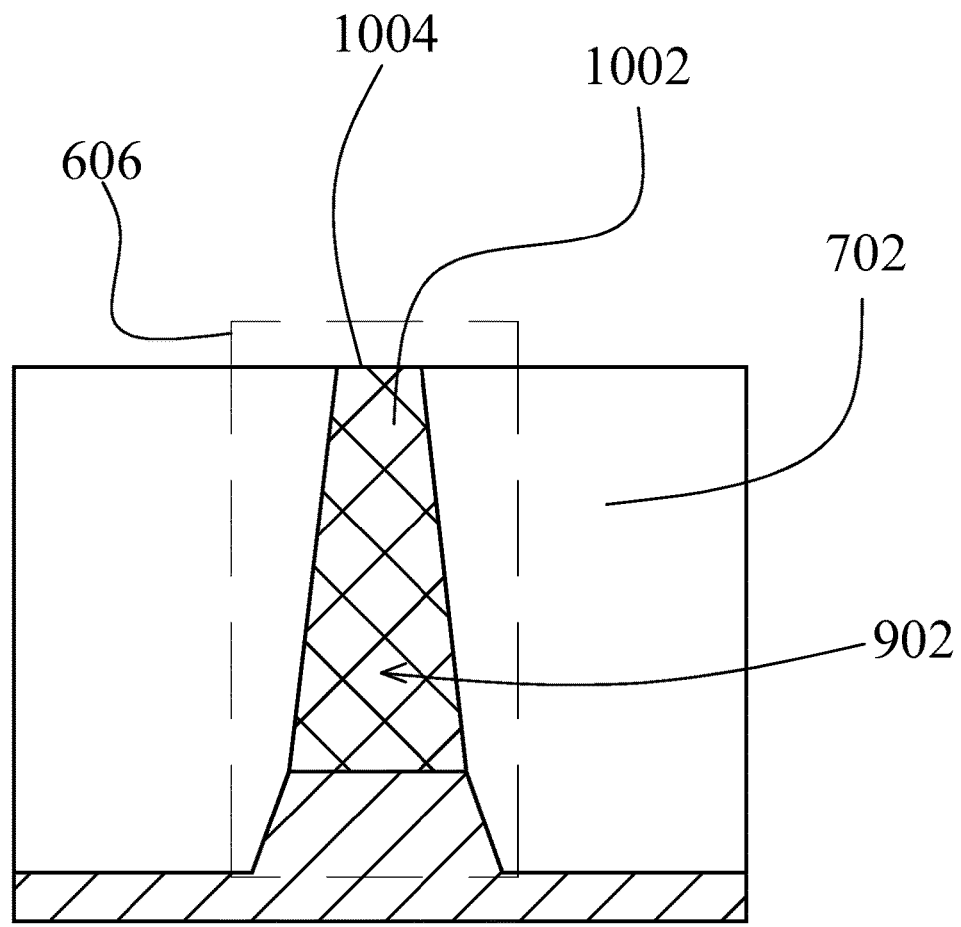
FIG. 10 is a sectional view illustrating the exemplary structure for forming the fin structure in accordance with some embodiments.

FIG. 10 is a sectional view illustrating the exemplary structure for forming the fin structure 600 in accordance with some embodiments. As shown in FIG. 10, a second dielectric layer (not shown) is formed in the second recess 902 as a second core portion 1002 of a fin core 606. A chemical mechanical polishing process may be performed on the oxide layer 702 and stop on a top 1004 of the fin core 606.

Figure 11:
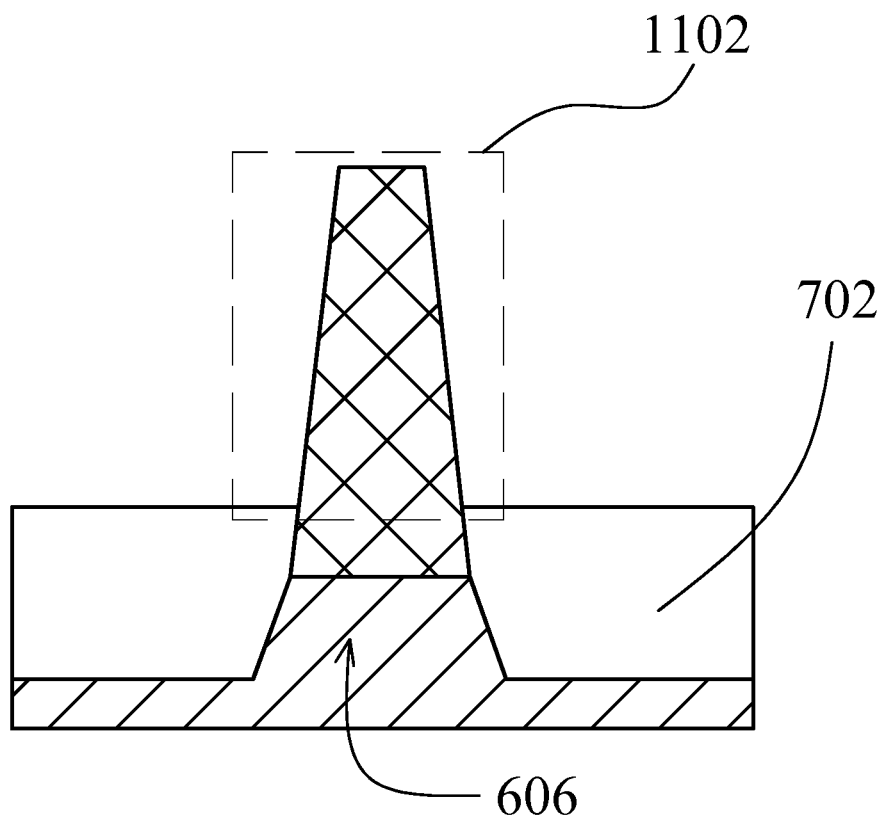
FIG. 11 is a sectional view illustrating the exemplary structure for forming the fin structure in accordance with some embodiments.

FIG. 11 is a sectional view illustrating the exemplary structure for forming the fin structure 600 in accordance with some embodiments. As shown in FIG. 4, the oxide layer 702 is etched back to expose a portion 1102 of the fin core 606.

Figure 12:
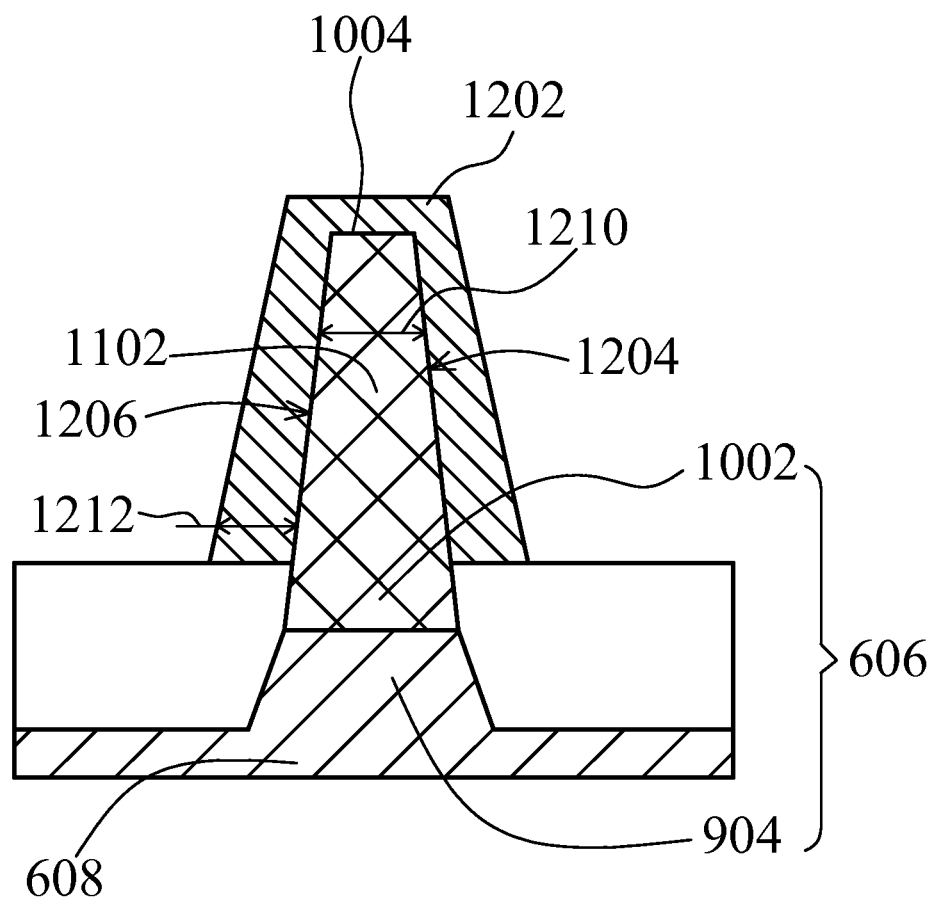
FIG. 12 is a sectional view illustrating the exemplary structure for forming the fin structure in accordance with some embodiments.

FIG. 12 is a sectional view illustrating the exemplary structure for forming the fin structure 600 in accordance with some embodiments. As shown in FIG. 12, a fin shell 1202 is formed to cover sidewalls 1204, 1206 of the exposed portion 1102 of the fin core 606. In the embodiment, the top 1004 of the fin core 606 is covered by the fin shell 1202. In another embodiment, the fin shell 1202 over the top 1004 of the fin core 606 may be further removed to reduce lattice dislocation.

In detail, the fin structure 600 at least includes the fin core 606 and the fin shell 1202. The fin core 606 protrudes from the substrate 608, and the fin shell 1202 covers a portion of sidewalls 1204, 1206 of the fin core 606. The fin core 606 includes the first core portion 904 and the second core portion 1002. The second core portion 1002 is disposed over the first core portion 904. The material of the second core portion 1002 has a lattice constant between the material of the first core portion 904 and the material of the fin shell 1202.

In the embodiment, the first core portion 904 of the fin core 606 may be formed of silicon, the second core portion 1002 of the fin core 606 may be formed of silicon-germanium, and the fin shell 1202 may be formed of indium gallium arsenide. In another embodiment, the first core portion 904 of the fin core 606 may be formed of silicon, the second core portion 1002 of the fin core 606 may be formed of germanium, and the fin shell 1202 may be formed of III-V compounds.

The fin structure 600 may be used as a quantum confinement structure with a fin shell 1202 as the channel layer and with a fin core 606 as the barrier layer. The fin core 606 may enhance the device performance by alleviate scattering from the fin shell 1202 across the fin core 606. Additionally, the fin core 606 may be used as a buffer layer to alleviate lattice dislocation in the fin shell 1202 or in the fin core 606.

Due to channel quantum confinement and channel formation, the fin core 606 may have a width 1210 of about several nanometers to tens of nanometers, for example, 3 nm-15 nm. The fin shell 1202 may have a thickness 1212 of about several nanometers to tens of nanometers, for example, 2 nm-10 nm. Further details of selecting the thickness 1212 of the fin shell 1202 and the width 1210 of the fin core 606 may be elaborated later. Additionally, said width 1210 and said thickness 1212 may refer to a minimum, a maximum or an average. With careful selection of the fin shell thickness 1212 and the fin core width 1210, the fin structure 600 may endure about 4%-8% lattice mismatch between the first core portion 904 and the fin shell 1202 without lattice dislocation.

Figure 13:
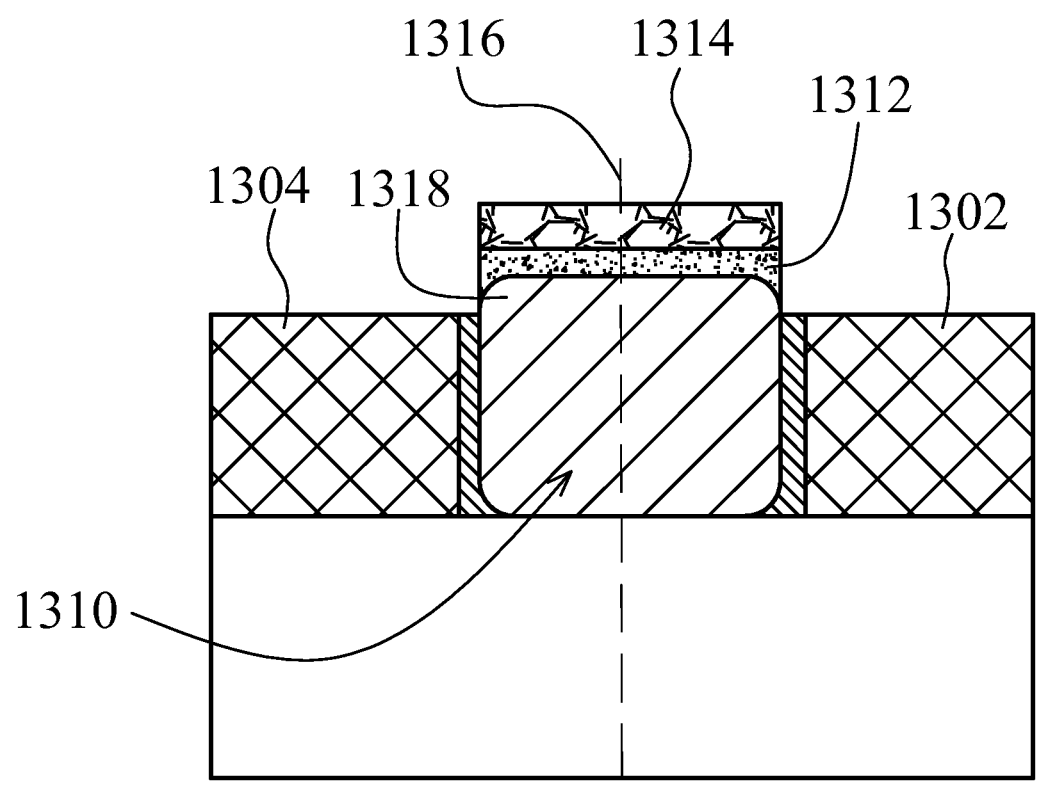
FIG. 13 is a sectional view illustrating an exemplary structure for forming a semiconductor device 1300 in accordance with some embodiments.

FIG. 13 is a sectional view illustrating an exemplary structure for forming a semiconductor device 1300 in accordance with some embodiments. As shown in FIG. 13, the semiconductor device 1300 includes a source region 1302, a drain region 1304, a gate dielectric 1312, a gate electrode 1314 and a fin structure 1310. The fin structure 1310 is similar to the fin structure 600 in FIG. 12. The gate dielectric 1312 covers the fin shell 1318. The gate electrode 1314 covers the gate dielectric 1312. The fin structure 1310 connects the source region 1302 and the drain region 1304, and the fin shell 1318 serves as a channel region of the semiconductor device 1300. Along the line 1316 in FIG. 13, a cross-sectional view of the semiconductor device 1300 is illustrated as FIG. 12.

Figure 14:
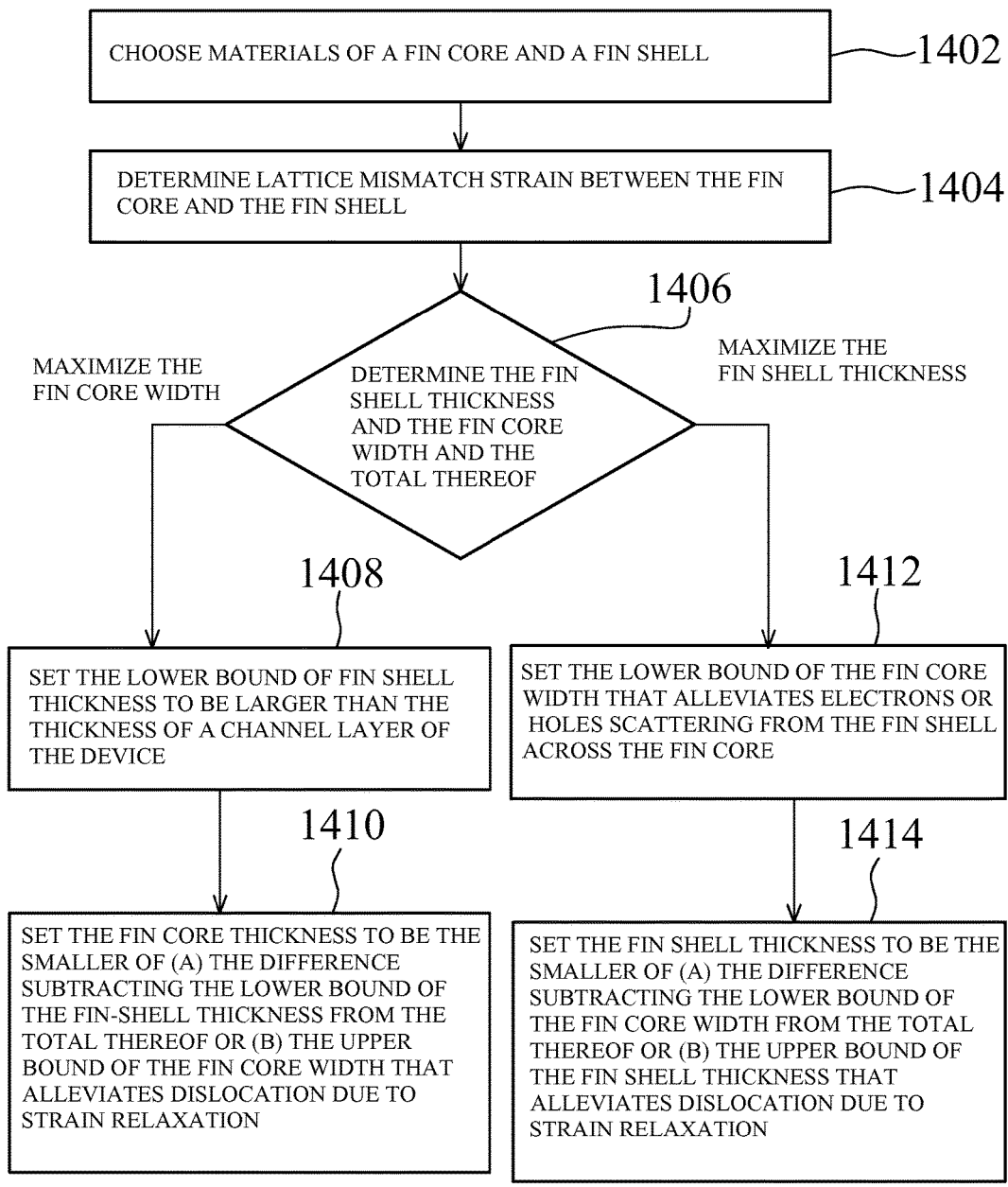
FIG. 14 is a flow chart illustrating a procedure of determining the thickness of the fin shell and the width of the fin core in accordance with some embodiments.

FIG. 14 is a flow chart illustrating a procedure of determining the thickness of the fin shell and the width of the fin core in accordance with some embodiments. As shown in FIG. 14, a procedure 1400 of determining thickness of the fin shell and the width of the fin core is provided. The procedure 1400 includes the following operations: choosing materials of a fin core and a fin shell (1402); determining lattice mismatch strain between the fin core and the fin shell (1404); determining the fin shell thickness and the fin core width and the total thereof (1406); when maximizing the fin core width, setting the lower bound of fin shell thickness to be larger than the thickness of a channel layer of the device (1408), and then setting the fin core thickness to be the smaller of (a) the difference subtracting the lower bound of the fin-shell thickness from the total thereof or (b) the upper bound of the fin core width that alleviates dislocation due to strain relaxation (1410); when maximizing the fin shell thickness, setting the lower bound of the fin core width that alleviates electrons or holes scattering from the fin shell across the fin core (1412); and then setting the fin shell thickness to be the smaller of (a) the difference subtracting the lower bound of the fin core width from the total thereof or (b) the upper bound of the fin shell thickness that alleviates dislocation due to strain relaxation (1414).

The boundary of the fin shell thickness and the fin core width will be described. In detail, the lower bound of the fin core thickness may be limited to a barrier height that alleviates tunneling/scattering from the fin shell across the fin core. The upper bound of the fin core thickness may be limited to mechanical/physical compliance to the material of the fin shell. The lower bound of the fin shell width may be limited to formation of a conductive channel layer, such as an inversion layer or an accumulation layer. The upper bound of the fin shell width may be limited to mechanical/physical compliance to the material of the fin core.

Figure 15:
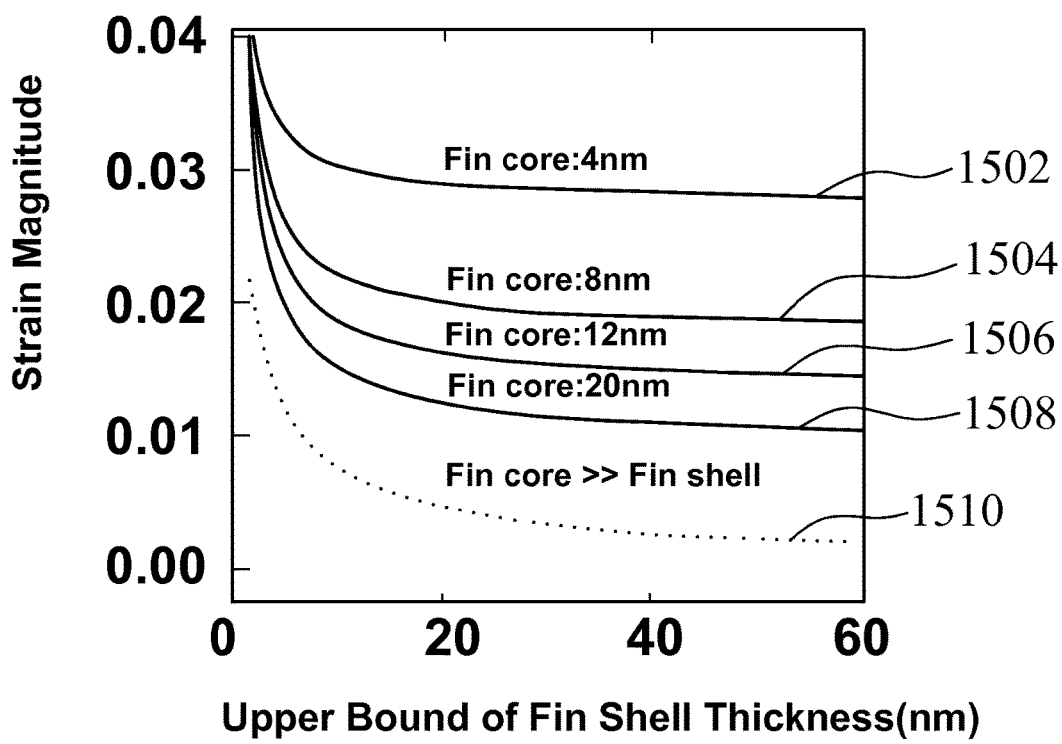
FIG. 15 is a graph illustrating a relationship among the fin core thickness, the fin shell width and a strain due to the lattice mismatch between the fin core and the fin shell in accordance with some embodiments.

FIG. 15 is a graph illustrating a relationship among the fin core thickness, the fin shell width and a strain due to the lattice mismatch between the fin core and the fin shell in accordance with some embodiments. As shown in the graph 1500, x-axis refers to the upper bound of the fin shell thickness; y-axis refers to magnitude of the strain. Curves 1502-1510 respective indicate the strains under circumstances that the fin core widths are 4 nm, 8 nm, 12 nm, 20 nm and that the fin core width dominates the fin shell thickness. It is observed that when the fin core thickness and the fin shell width are both set to be thin enough, the strain due to the lattice mismatch are reduced to alleviate lattice dislocation.

Figure 16:
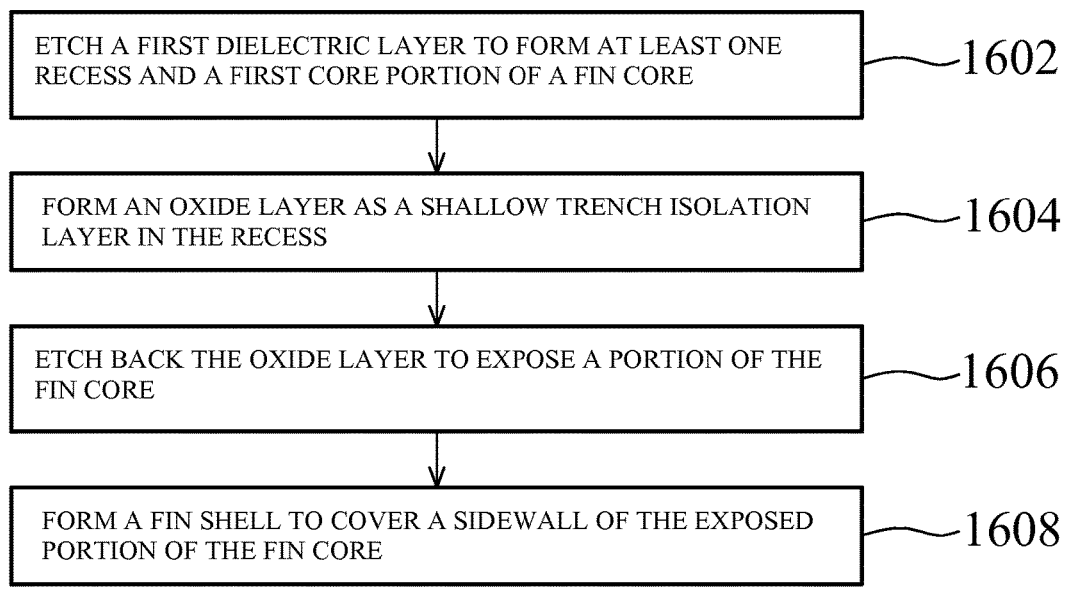
FIG. 16 is a flow chart for forming a fin structure in accordance with some embodiments.

FIG. 16 is a flow chart for forming a fin structure in accordance with some embodiments. As shown in FIG. 16, a method 1600 is provided. The method 1600 includes the following operations: etching a first dielectric layer to form at least one recess and a first core portion of a fin core (1602); form an oxide layer as a shallow trench isolation layer in the recess (1604); etching back the oxide layer to expose a portion of the fin core (1606); and forming a fin shell to cover a sidewall of the exposed portion of the fin core (1608).

Figure 17:
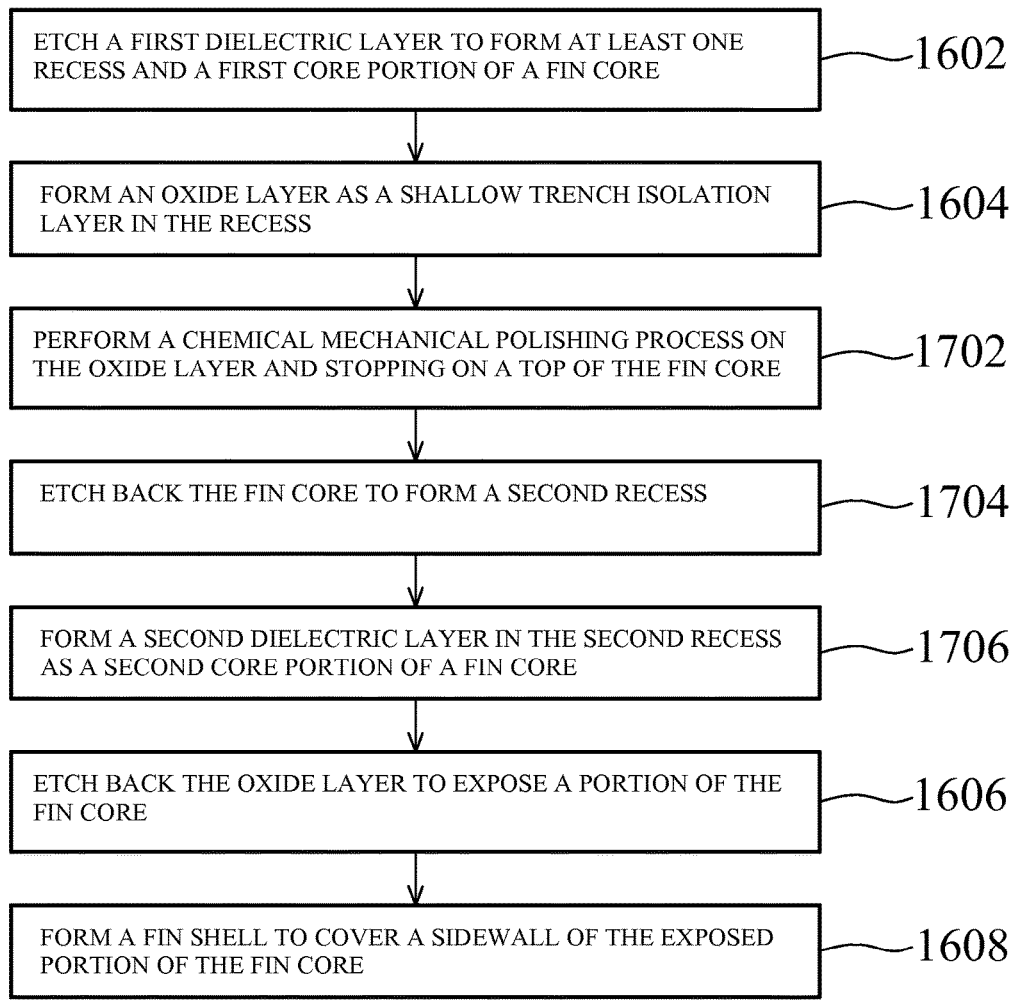
FIG. 17 is another flow chart for forming a fin structure in accordance with some embodiments.

FIG. 17 is another flow chart for forming a fin structure in accordance with some embodiments. As shown in FIG. 17, a method 1700 is provided. The method 1700 includes the following operations: etching a first dielectric layer to form at least one recess and a first core portion of a fin core (1602); form an oxide layer as a shallow trench isolation layer in the recess (1604); performing a chemical mechanical polishing process on the oxide layer and stopping on a top of the fin core (1702); etching back the fin core to form a second recess (1704); forming a second dielectric layer in the second recess as a second core portion of a fin core (1706); etching back the oxide layer to expose a portion of the fin core (1606); forming a fin shell to cover a sidewall of the exposed portion of the fin core (1608). The method 1700 may further include the operation of forming the fin shell to cover a top of the fin core.

According to an exemplary embodiment, a fin structure is provided. The fin structure includes a fin core and a fin shell. The fin core protrudes from a substrate. The fin shell covers a portion of a sidewall of the fin core.

According to an exemplary embodiment, a semiconductor device is provided. The semiconductor device includes a source region, a drain region, a gate electrode, a gate dielectric and a fin structure. The fin structure includes: a fin core protruding from a substrate; and a fin shell covering a portion of a sidewall of the fin core. The gate dielectric covers the fin shell. The gate electrode covers the gate dielectric. The fin structure connects the source region and the drain region, and the fin shell serves as a channel region of the semiconductor device.

According to an exemplary embodiment, a method of forming a fin structure is provided. The method includes the following operations: etching a first dielectric layer to form at least one recess and a first core portion of a fin core; form an oxide layer as a shallow trench isolation layer in the recess; etching back the oxide layer to expose a portion of the fin core; and forming a fin shell to cover a sidewall of the exposed portion of the fin core.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
    a fin core protruding from a substrate and including:
        opposite first and second side surfaces,
        a first core portion, and
        a second core portion over the first core portion; and
    a fin shell covering the fin core, wherein a material of the second core portion has a lattice constant between a material of the first core portion and a material of the fin shell;
    a gate dielectric covering the fin shell; and
    a gate electrode covering the gate dielectric, wherein the fin shell is configured to function as a channel region between a source and a drain, and the fin shell is between the fin core and the gate dielectric, and the gate dielectric is between the fin shell and the gate electrode; and a shallow trench isolation layer that covers a bottom portion of each of the first and second side surfaces of the fin core;

wherein the fin shell overlies a top surface of the fin core, and overlies each of the first and second side surfaces of the fin core from the fin core's top surface down to a top surface of the shallow trench isolation layer.

2. The device of claim 1, wherein the fin core has a width of about 3 nm to about 15 nm, and the fin shell has a thickness of about 2 nm to about 10 nm.

3. The device of claim 1, wherein the fin core is formed of silicon or germanium, and the fin shell is formed of III-V compound.

4. The device of claim 1, wherein the fin core is formed of silicon, and the fin shell is formed of germanium.

5. The device of claim 1, wherein the fin core is used as a barrier layer to alleviate electron scattering from the fin shell across the fin core.

6. The device of claim 1, wherein the fin core is used as a buffer layer to alleviate lattice dislocation.

7. The device of claim 1, wherein the fin shell is formed of indium gallium arsenide.

8. The device of claim 1, wherein the shallow trench isolation layer is an oxide layer.

9. The device of claim 1, wherein the fin shell consists of germanium.

10. The device of claim 1, wherein the fin core is an upward projection of the substrate.

11. A semiconductor device, comprising:
a source region;
a drain region;
a fin structure, comprising:
  a fin core protruding from a substrate; and
  a fin shell covering a portion of a sidewall of the fin core;
a gate dielectric covering the fin shell; and
a gate electrode covering the gate dielectric, wherein the fin structure connects the source region and the drain region, and the fin shell serves as a channel region of the semiconductor device;
wherein the fin core comprises:
  a first core portion; and
  a second core portion over the first core portion, wherein a material of the second core portion has a lattice constant between a material of the first core portion and a material of the fin shell.

12. A semiconductor device, comprising:
a fin core that protrudes from a substrate and comprises
  a first core portion that includes opposite first and second side surfaces, and
  a second core portion that overlies the first core portion and includes opposite first and second side surfaces, wherein the second core portion has a lattice constant between a lattice constant of the first core portion and a lattice constant of the fin shell;
a fin shell covering the fin core;
a gate dielectric covering the fin shell; and
a gate electrode covering the gate dielectric, wherein the fin shell is configured to function as a channel region between a source and a drain, and the fin shell is between the fin core and the gate dielectric, and the gate dielectric is between the fin shell and the gate electrode; and
a shallow trench isolation layer that overlies each of the first and second side surfaces of the first core portion from a bottom of the first core portion to a top of the first core portion, and overlies the first and second side surfaces of the second core portion from a bottom of the second core portion to a bottom of the fin shell;
wherein the fin shell overlies a top surface of the second core portion, and overlies each of the first and second side surfaces of the second core portion from the second core portion's top surface down to a top surface of the shallow trench isolation layer.

13. The device of claim 12, wherein the fin core has a width of about 3 nm to about 15 nm, and the fin shell has a thickness of about 2 nm to about 10 nm.

14. The device of claim 12, wherein the fin core is formed of silicon or germanium, and the fin shell is formed of III-V compound.

15. The device of claim 12, wherein the fin core is formed of silicon, and the fin shell is formed of germanium.

16. The device of claim 12, wherein the fin core is used as a barrier layer to alleviate electron scattering from the fin shell across the fin core.

17. The device of claim 12, wherein the shallow trench isolation layer is an oxide layer.

18. The device of claim 12, wherein the fin shell is formed of indium gallium arsenide.

19. The device of claim 12, wherein the fin shell consists of germanium.

20. The device of claim 12, wherein the first core portion is an upward projection of the substrate.

* * * * *